United States Patent [19]

Loeffler

[11] Patent Number: 4,801,874

[45] Date of Patent: Jan. 31, 1989

[54] METHOD AND APPARATUS FOR MEASURING ELECTRICITY

[75] Inventor: Horst R. Loeffler, Clover, S.C.

[73] Assignee: Process Systems, Inc., Charlotte, N.C.

[21] Appl. No.: 20,077

[22] Filed: Feb. 27, 1987

[51] Int. Cl.⁴ .................... G01R 21/00; G01R 7/00
[52] U.S. Cl. ................... 324/142; 324/141; 364/483
[58] Field of Search .............. 324/141, 142, 76; 340/637; 364/483, 481, 841

[56] References Cited

U.S. PATENT DOCUMENTS

| | | | |
|---|---|---|---|
| 3,525,042 | 8/1970 | Nunlist et al. | 324/142 X |
| 3,794,917 | 2/1974 | Martin et al. | 324/142 |
| 3,818,206 | 6/1974 | Brunner et al. | 235/194 |
| 3,875,509 | 4/1975 | Milkovic | 324/142 |
| 3,934,198 | 1/1976 | Milkovic | 324/142 |
| 3,947,763 | 3/1976 | Milkovic | 324/142 |
| 3,953,795 | 4/1976 | Brunner et al. | 324/142 |
| 3,955,138 | 5/1976 | Milkovic | 324/107 |
| 3,976,942 | 8/1976 | Mayfield | 324/142 |
| 4,027,241 | 5/1977 | Jauch | 324/142 |
| 4,056,775 | 11/1977 | Milkovic | 324/142 |
| 4,058,768 | 11/1977 | Milkovic | 324/142 |
| 4,066,960 | 1/1978 | Milkovic | 324/142 |
| 4,074,194 | 2/1978 | Wilkerson | 324/142 |
| 4,079,313 | 3/1978 | Callan | 324/142 X |
| 4,092,592 | 5/1978 | Milkovic | 324/142 |
| 4,145,652 | 3/1979 | Hayashi | 324/142 |
| 4,217,545 | 8/1980 | Kusui et al. | 324/142 |
| 4,217,546 | 8/1980 | Milkovic | 324/142 |
| 4,224,671 | 9/1980 | Sugiyama et al. | 364/483 |
| 4,250,449 | 2/1981 | Shum | 324/142 |
| 4,254,376 | 3/1981 | Steinmuller | 324/142 |
| 4,257,004 | 3/1981 | Miller | 324/141 |
| 4,275,349 | 6/1981 | Wintermute | 324/141 |
| 4,315,212 | 2/1982 | Gamoh | 342/142 |
| 4,378,524 | 3/1983 | Steinmuller | 324/107 |
| 4,456,878 | 6/1984 | Gamoh | 324/142 |
| 4,535,287 | 8/1985 | Milkovic | 324/142 X |
| 4,622,640 | 11/1986 | Shimamura et al. | 364/483 X |
| 4,742,296 | 5/1988 | Petr et al. | 324/142 X |

Primary Examiner—Reinhard J. Eisenzopf
Assistant Examiner—Vinh P. Nguyen
Attorney, Agent, or Firm—Bell, Seltzer, Park & Gibson

[57] ABSTRACT

The method and apparatus disclosed relates to the electronic measurement of the electricity used by a load. The apparatus generates a rectified voltage signal proportional to the load voltage. A frequency modulated pulse train is generated in response to the load voltage signal, with the frequency of the pulses being proportional to the instantaneous amplitude of the rectified load voltage. A load current signal is generated that is proportional to the load current. A logic circuit gates the load current signal during each pulse of the frequency modulated pulse train to generate a signal representing the product of the instantaneous load voltage and the instantaneous load current. This signal from the logic means may be integrated over time to generate a signal representing the amount of electric energy used by the load. A method for practicing this invention is also disclosed.

33 Claims, 3 Drawing Sheets

METHOD AND APPARATUS FOR MEASURING ELECTRICITY

FIELD OF THE INVENTION

This invention relates to apparatus for electronically measuring the amount of electricity at a load. It eliminates moving mechanical and induction components, such as electromagnetic motors, and uses a frequency modulated train of pulses to generate a signal representing the product of two instantaneous load signals, such as the instantaneous load voltage and the instantaneous load current.

BACKGROUND OF THE INVENTION

The instantaneous electrical power (watts) supplied to a load is measured by multiplying the instantaneous load voltage times the instantaneous load current. The energy consumed by a load (watt hours) is measured by integrating the instantaneous power over time. Alternating current power has been measured in the past by multiplying the peak voltage and peak current together with a power factor, but this requires circuitry for measuring the peak values of the voltage and current components, and further circuitry to determine the difference in the phase angles between the voltage and current components. Other devices sampled the current only when the voltage component was at its peak value, or vice versa. While this eliminates the need to determine the phase angle, it has experienced limitations with respect to the sampling rate or frequency of operation.

Still other prior art devices use pulse width modulation techniques to multiply instantaneous voltage and current signals, and thereby obtain a product signal representing the instantaneous power. For example, a load current signal is supplied to a duty cycle modulator which generates a train of pulses of constant amplitude and constant frequency, but with a duration, or width, that is modulated in response to the load current signal. This train of pulses typically gates a switching element, with the duty cycle, or "on" time, of the switching element varying in response to the width of the pulses in the pulse train. Such prior art devices may operate under ideal or laboratory conditions, but suffer degradations in accuracy in the presence of harmonics in the load current and load voltage signals, and have restrictions on their operational ranges due to the effect of variations in environmental temperature, power factor and load. Specifically, pulse width modulation circuits, and other electronic circuits for measuring electric energy, typically require accurate clock and time base circuits to ensure the very high degree of accuracy required by electric utilities. Unfortunately, these circuits are complex and expensive, and like most semiconductor devices, sensitive to variations in temperature, circuit bias conditions, and non-ideal signals. Other prior art electronic circuits for measuring the electric energy used by a load suffer from a narrow bandwidth of operation. This means they are unable to measure power over a wide frequency range and still remain accurate in the presence of harmonics or other variations in the load voltage and load current signals.

Accordingly, it is an object of the present invention to provide a method and apparatus for electronically measuring the amount of electric power used by a load.

It is a further object of the present invention to provide a method and apparatus for accurately measuring the amount of electric power used by a load over a broad bandwidth, and provide an accurate measure even in the presence of harmonics in the load current and load voltage signals.

It is a still further object of the present invention to provide a method and apparatus for electronically measuring the amount of electric power used by a load using digital techniques when the voltage and current applied to the load are analog signals.

It is a still further object of the present invention to provide a method and apparatus for electronically measuring electricity.

These and other objects of the present invention are accomplished with the method and apparatus of the present invention. In one embodiment for measuring power used by a load, the apparatus includes means for generating a rectified voltage signal proportional to the load voltage. A frequency modulated pulse train is generated in response to the load voltage signal, with the frequency of the pulses being proportional to the instantaneous amplitude of the rectified load voltage. A load current signal is generated that is proportional to the load current. A logic circuit gates the load current signal during each pulse of the frequency modulated pulse train to generate a signal representing the product of the instantaneous load voltage and the instantaneous load current. This signal from the logic means may be integrated over time to generate a signal representing the amount of electric energy used by the load. A method for practicing this invention is also disclosed.

DESCRIPTION OF THE INVENTION

Figure 1:
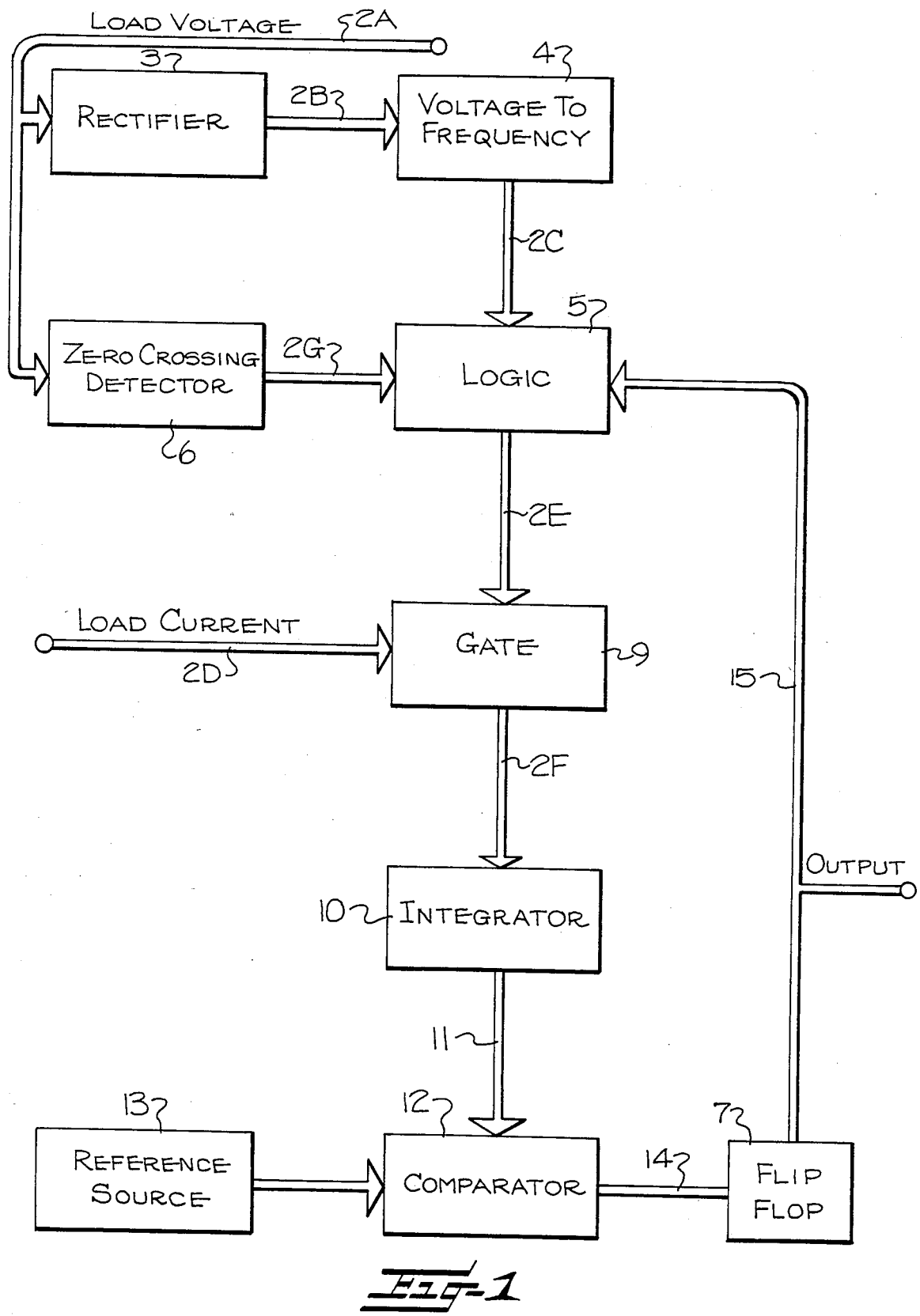
FIG. 1 is a schematic block diagram of the invention.

Referring to FIG. 1, and as more specifically explained below, the load voltage is rectified, and the rectified voltage is used to continuously generate a train of pulses having an instantaneous frequency that is proportional to the instantaneous rectified voltage. Each pulse has a uniform duration and amplitude. The frequency modulated pulse train is continuously supplied to the control input of a gate circuit. A load current signal is also received at the signal input of the gate circuit. The load current signal is passed through the gate during each pulse of the pulse train, outputting a train of frequency modulated and amplitude modulated pulses. This train of output pulses represents the instantaneous load current multiplied by the instantaneous load voltage and is designated the power signal. Thus, as the instantaneous load voltage increases, the frequency of the power pulses increases; and, as the instantaneous load current increases, the amplitude of the power pulses increases. The power pulses, representing watts, may be integrated over time (i.e. the area under each pulse) to generate a signal representing the amount of electric energy or watt-hours used by the load. An up-down integrator may be used, and logic circuitry monitors the zero crossings of the voltage and the integrated value of the energy signal to reverse the direction of integration.

Figure 2:
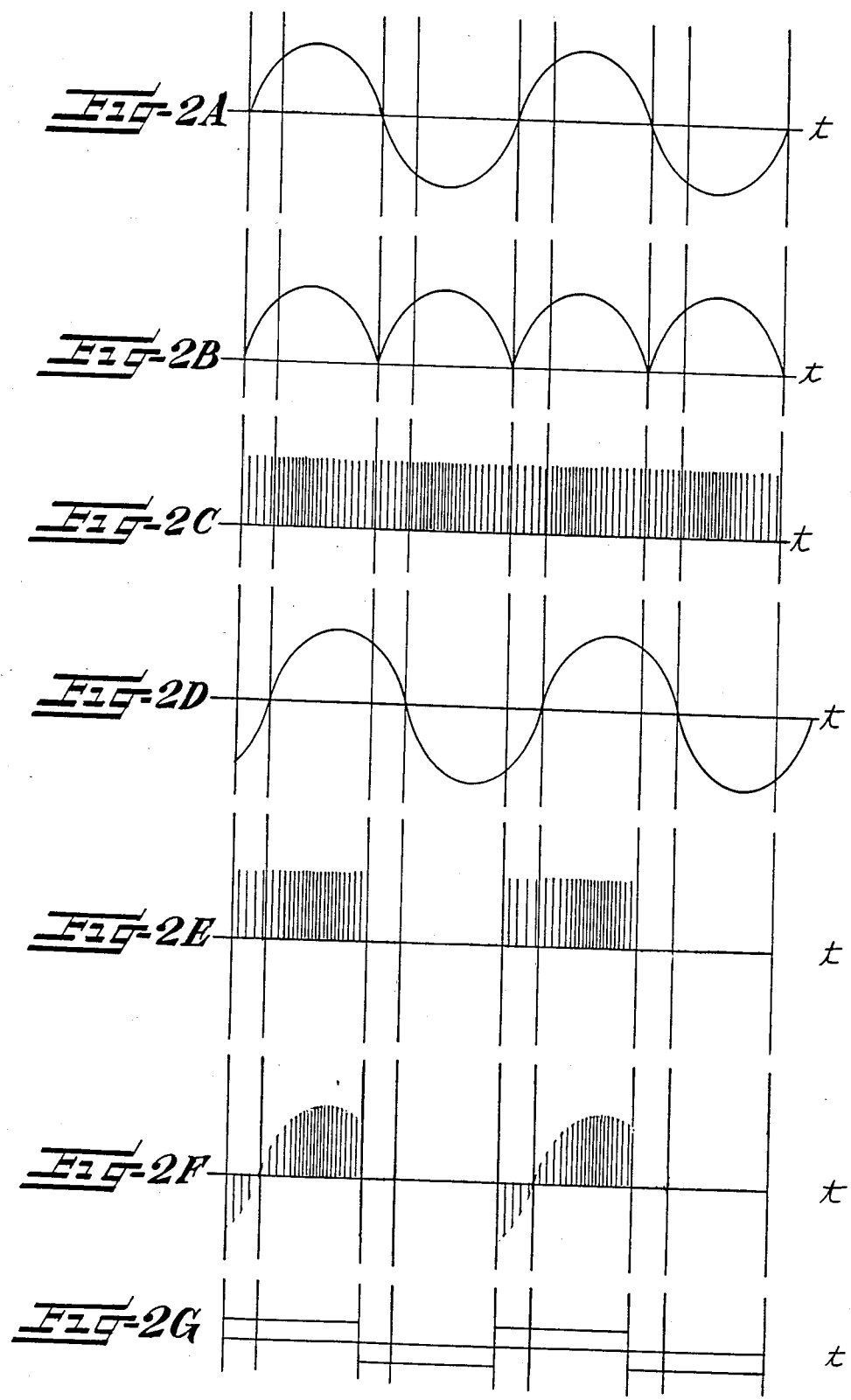
FIGS. 2A–2G are diagrams of signal waveforms with respect to time for various points in FIGS. 1 and 3.

More specifically, the load voltage, or a signal representing the instantaneous amplitude of the load voltage with respect to time, is supplied on line 2A to the rectifier 3. The load voltage typically has positive and negative portions as illustrated by the waveform of FIG. 2A, which represents the signal waveform of the voltage potential with respect to time. Although a sine wave voltage waveform with positive and negative portions is most common, the invention will operate with different voltage waveforms, including different frequencies, varying frequencies, DC components, harmonics and DC voltages.

Assuming that the line voltage has negative portions, the rectifier 3 inverts all of the negative going portions to provide an all positive, or rectified, voltage signal on line 2B, such as that illustrated in FIG. 2B. FIG. 2B illustrates the signal waveform of the rectified voltage potential with respect to time for the load voltage illustrated in FIG. 2A.

A voltage to frequency converter 4 generates a frequency modulated pulse train of signals in response to the rectified voltage signal received on line 2B. The instantaneous frequency or repetition rate of the pulses, which are output on line 2C, is proportional to the instantaneous amplitude of the rectified voltage signal. Each pulse has a constant width of duration, such as five microseconds, and the width of each pulse may be controlled by an RC circuit. Each pulse also has a constant height or voltage. FIG. 2C illustrates a sample pulse train for the conversion of the rectified voltage of FIG. 2B. Note that the frequency of the pulses increases when the rectified voltage on line 2B increases, and the frequency of the pulses decreases when the rectified voltage on line 2B decreases. By way of example, the pulse frequency rate may vary from 0 pulses per second at 0 volts to 100,000 pulses per second at 6 volts.

The voltage to frequency pulse train on line 2C is supplied to the control input of a logic circuit or gate 5, which also receives control signals from a zero voltage crossing detector 6 and a flip-flop 7. The load current, or a signal representing the instantaneous amplitude of the load current with respect to time, is supplied on line 2D to the signal input of the gate. Like the load voltage, the load current signal may include positive and negative going portions, and it may also be phase shifted from the load voltage, as illustrated by comparing the waveforms in FIGS. 2A and 2D. FIG. 2D illustrates the signal waveform of the load current with respect to time. Although the illustrated waveform is a sine wave, the invention is compatible with other current waveforms, as noted with respect to the load voltage.

The gate transmits the instantaneous load current signal present during each pulse of the pulse train, generating on line 2F the power signal waveform shown in FIG. 2F. FIG. 2F illustrates the product of the instantaneous load voltage and the instantaneous load current with respect to time. The number of pulses is proportional to the instantaneous voltage and the height of the pulses is proportional to the instantaneous current.

An up-down or dual slope integrator 10 receives the output or power signals on line 2F and integrates them over time to generate a signal representing the amount of electric energy used by the load. The output of the integrator is provided on line 11 to a comparator 12, which puts up-down limits on the integrator. The comparator also receives a signal from reference source 13 and, when the signal from the integrator on line 11 exceeds the value of the reference source signal, the comparator outputs a signal on line 14 to flip-flop 7.

The zero crossing detector determines when the line voltage has changed from a positive voltage to a negative voltage. The output signal is provided on line 2G, and is illustrated in FIG. 2G. FIG. 2G represents the signal waveform of the logic signal with respect to time. This logic signal is provided to the logic circuit 5. In this manner the loss of the sign of the load voltage through rectification is recaptured for accurate measurement of the power consumed. Flip-flop 7 changes state in response to the signal output on line 14 from the comparator. The output of the flip-flop, on line 15, provides a feedback signal to the logic circuit 5. The logic circuit 5 combines the signal from the flip-flop 7 on line 15 with the output signal from the zero crossing detector on line 2G. Functionally, the logic circuit inverts the pulses on line 2C in response to a predetermined change in state of the zero crossing detector or the flip-flop 7. As a result, in the illustrated embodiment, the pulses are negative only when one of the voltage or current is negative. This is illustrated in FIG. 2E. The inversion of the pulses inverts the output signal on line 2F, changing the direction of operation of the integrator, which otherwise would integrate to infinity or saturation.

The output signal from the flip-flop 7 also reflects that a predetermined amount of power has been used for a period of time, signifying that one unit of energy has been used by the load. Specifically, the signal from the integrator on line 11 represents the instantaneous watt hours consumed, and the signal on line 15 reflects that a predetermined quantity of watt hours has been consumed. The size of this energy unit may be changed as necessary or desirable by changing the level of the signal from the reference source, adjusting the conversion constant of the number of pulses per volt, adjusting the gate voltage, adjusting the gain in the voltage or current channels, etc.

Figure 3:
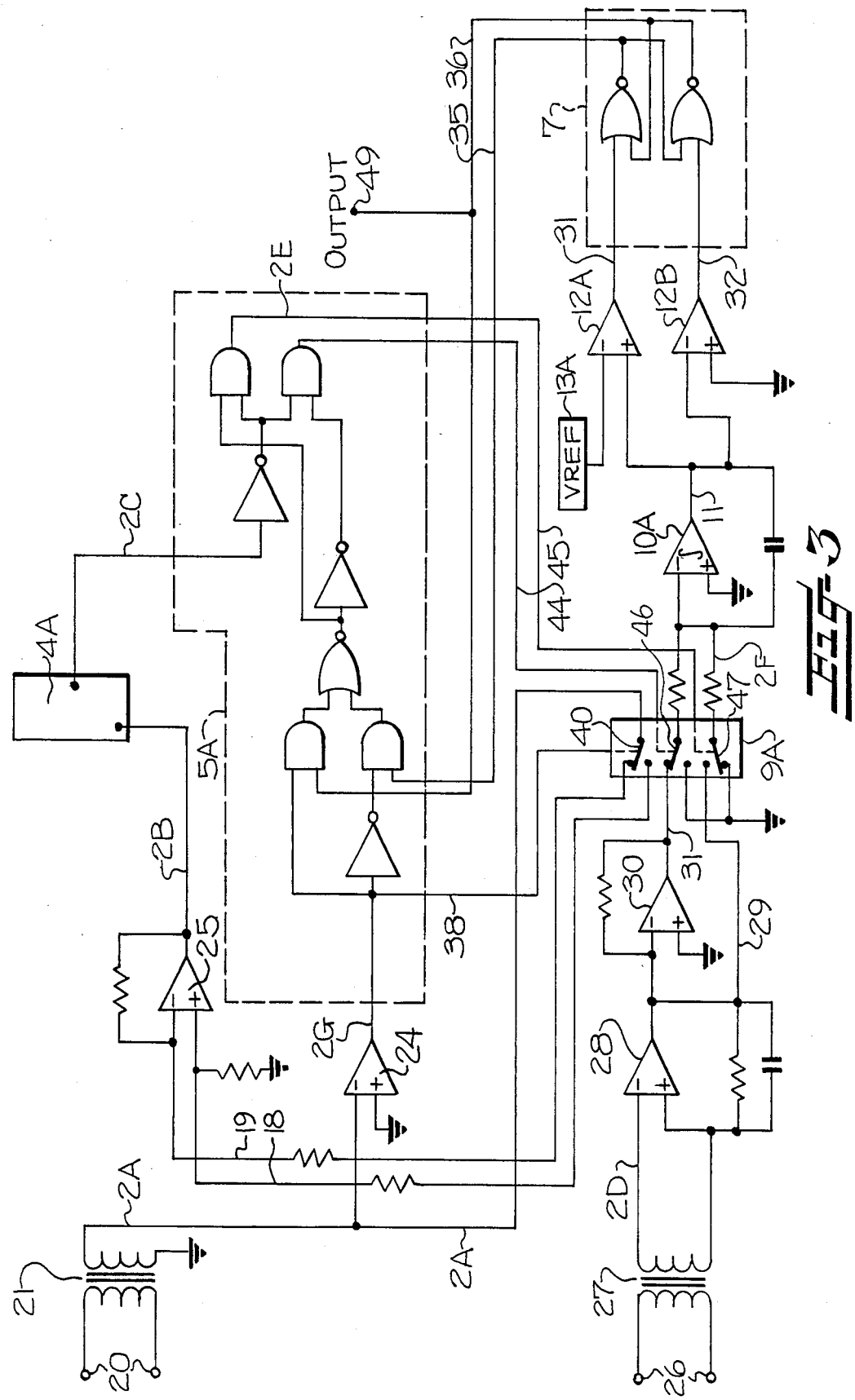
FIG. 3 is a simplified schematic diagram of the invention.

Referring to FIG. 3, a schematic diagram of the invention is illustrated. Some elements not necessary to a complete understanding of the invention have been omitted for clarity, such as biasing resistors and a power supply for the integrated and logic circuits, but the inclusion of such elements are well within the scope of one skilled in the art. The reference numerals in FIG. 3 correspond with the signal lines and elements of FIGS. 1 and 2A–2G.

The load voltage is applied to terminals 20 of transformer 21, providing an output signal on line 2A representing the instantaneous amplitude of the load voltage, as shown in the voltage waveform in FIG. 2A. The relative amplitude of the waveform may be adjusted as necessary or desirable to be compatible with the amplitude of the circuit logic signals. For measurement of reactive power a phase shift network may be inserted into line 2A to provide a phase shift of 90° between the load voltage and load current signals.

The load voltage signal is received by the inverting input of operational amplifier 24. Its positive input is grounded, so it functions as a zero crossing detector (reference numeral 6 in FIG. 1) and outputs a signal waveform on line 2G as illustrated in FIG. 2G. The load voltage signal is also supplied to a signal input terminal of gate 9A, which may be an analog switch such as MC14053. The analog switch supplies the load voltage waveform to one of two signal output terminals, which are connected via lines 18, 19 to the positive or inverting input of operational amplifier 25, which functions as a rectifier (reference numeral 3 in FIG. 1). The output waveform from the rectifier on line 2B is illustrated in FIG. 2B. All of the operational amplifiers illustrated in the figures may be, for example, TL084 circuits.

The rectified voltage signal is provided to the voltage to frequency converter 4A. This corresponds to reference numeral 4 in FIG. 1 and generates a frequency modulated pulse train of signals on line 2C, as illustrated in FIG. 2C. As described earlier, the instantaneous frequency of the pulses is proportional to the instantaneous amplitude of the rectified load voltage signal, and is supplied to the logic circuitry 5A, which corresponds to reference numeral 5 in FIG. 1. The voltage to frequency converter may be an LM231 integrated circuit. The frequency output range may vary as necessary or desirable.

A load current signal is provided at terminals 26 of a matching transformer 27, providing an output signal on line 2D representing the instantaneous amplitude of the load current, such as is shown in the current waveform in FIG. 2D. The relative amplitude of the waveform may be adjusted to be compatible with the circuit logic levels.

The load current signal is applied to operational amplifier 28, which outputs a load current signal on line 29. The signal on line 29 is supplied to the inverting input of operational amplifier 30, which inverts the sign of the load current signal and provides an output on line 31. These load current signals on lines 29 and 31 are of equal but opposite amplitudes, and are provided to separate signal input terminals of gate 9A. The load current signals on lines 29, 31 are alternately passed through gate 9A, as described later, resulting in the signal waveform illustrated in FIG. 2F. This signal waveform is applied to the negative input of integrator 10A.

Integrator 10A is an up-down integrator, such as an LT1012 operational amplifier that has been incorporated into a circuit in a manner that is well known in the art. The integrated output of the power signal waveform is supplied on line 11 to different inputs of a pair of operational amplifiers 12A, 12B which function as comparators (reference numeral 12 of FIG. 1). A signal from voltage reference source 13A is applied to the inverting input of operational amplifier 12A. The signal output from this amplifier on line 31 changes state when the signal from integrator 10A exceeds, or falls below, the value of the signal from the voltage reference source. The positive input of operational amplifier 12B is grounded, and the output signal on line 32 changes state when the signal on line 11 from integrator 10A crosses zero.

The logic signals on lines 31, 32 are supplied to the flip-flop 7. The output therefrom on lines 35, 36 is supplied to the logic circuitry 5A as illustrated. The signal on line 36 also represents that an amount of energy has been consumed and is output at terminal 49, which may be connected to a totalizer.

The logic circuitry 5A receives the zero crossing signals on line 2G, the frequency modulated train of pulses from converter 4A on line 2C, and the logic signals from flip-flop 7 on lines 35, 36. In response to these signals, it provides output signals on lines 38 and 44, 45 to the control inputs of gate 9A. The logic signal on line 38 is the inverted signal from the output of operational amplifier 24 functioning as a zero crossing detector. Logic switch 40 changes state in response to the signal on line 38, connecting the signal on line 2A to either line 18 or line 19.

The logic circuit responds to the logic signals on lines 2G, 2C, 35, and 36 by generating the output signals on lines 44 and 45. The signal on line 45 is represented by the waveform in FIG. 2E, which corresponds to the positive cycles of the load voltage in FIG. 2A. The signal on line 44 is represented by the waveform in FIG. 2E delayed by one half cycle to correspond to the negative cycles of the load voltage in FIG. 2A. The signals on lines 44, 45 operate, respectively, logic switches 46 and 47, logic switch 46 toggles between line 31 and ground, and logic switch 47 toggles between line 29 and ground. The output waveform from logic switch 47 is illustrated in FIG. 2F. This signal represents the product of the instantaneous load current times the instantaneous load voltage. The output waveform on line 46 is represented by the waveform in FIG. 2F delayed by one half cycle. The signals on lines 46 and 47 are summed and integrated to provide a signal representing watt hours on line 11.

In operation, the load voltage signal on line 2A is provided to a signal input terminal of logic gate 9A and to the inverting input of operational amplifier 24, which acts as a zero crossing detector. The output from the zero crossing detector is applied to the logic circuit 5A, which responds by providing an output signal on line 38 to a control input terminal of logic switch 40 in gate 9A. Logic switch 40 toggles between the output terminals connected to lines 18, 19, depending upon the state of the signal provided on line 38. This connects the load voltage signal on line 2A to either the positive or inverting input of operational amplifier 25, which functions, together with the operation of logic switch 40, as a rectifier and outputs a continuous signal representing the instantaneous load voltage, as in FIG. 2B.

The instantaneous rectified load voltage signal on line 2B is converted to the train of frequency modulated pulses by the voltage to frequency converter 4A, and this pulse train signal is received by the logic circuit on line 2C.

The instantaneous load current signal on line 2D is applied to operational amplifier 28. The output is applied directly to one signal terminal of logic gate 9A via line 29, and also to operational amplifier 30, which inverts the signal and provides it to a different signal terminal of the logic gate 9A, via line 31. Logic switches 46, 47 are normally connected to the grounded terminals of the gate 9A. Upon receipt of a pulse originating from the frequency modulated pulse train on line 2C, as modified by the logic circuit 5A, one of the logic switches 46, 47 connects the input of integrator 10A to the positive or inverted instantaneous line current signal on lines 29, 31. In FIG. 3 logic switch 46 connects the inverted load current signal to the input of the integrator, while logic switch 47 leaves the positive load current signal isolated. The width, or duration, of the pulses on line 2F is directly proportional to the amount of time that either of the logic switches 46, 47 connects the load current signal to the integrator. This is predetermined by the fixed width, or duration, of each individual pulse of the frequency modulated pulse train. The frequency with which pulses are provided on line 2F is directly related to the instantaneous amplitude of the load voltage. The amplitude of the pulses on line 2F is directly proportional to the amplitude of the instantaneous load current signal. Thus, the signal on line 2F represents the product of the instantaneous load voltage and instantaneous load current.

The output signal on line 11 from the up-down integrator 10A is received by comparators 12A, 12B and increases toward a level set by the voltage reference source 13 or ground. Upon reaching one of these references, the change in state of the output from the appropriate comparator on line 31 or 32 causes flip-flop 7 to change the state of the signals on lines 35, 36. The state of the output signal on line 36 is monitored via output terminal 49, and each change of state represents one unit of energy, such as watt hours.

The signals on lines 35, 36 are also logically combined with the frequency modulated pulse train on line 2C, changing the state of the signals on lines 44, 45 to the control inputs of the logic gate. In response to a change on one of these two lines, the logic gate switches 46, 47 change and invert of the load current signal so that the integrator 10A integrates in the opposite direction. Upon integrating to the other reference, the change in state of the output from the other comparator causes the logic circuit to again invert the state of the signals on lines 44, 45. The integrator now integrates in the opposite direction to measure a second unit of energy. If the integrator did not integrate in the opposite direction, it would integrate to saturation or infinity, or the integration of the positive and negative going portions of the load current would result in a cancellation, indicating that no power had been used.

The circuit of the invention measures true watt hours, as opposed to volt amp hours. Volt amp hours reactive may be measured by inducing a ninety degree phase shift into the incoming load voltage signal, i.e. by inserting a ninety degree phase shift circuit into line 2A. Q-hours may be measured in the same manner by inserting a sixty degree phase shift circuit into line 2A, rather than a ninety degree phase shift. Volt hours may be measured by supplying a constant current input for the load current signal, which results in pulses of a constant amplitude on line 2F. The frequency of the pulses will then vary in response to variations in the load voltage. Conversely, amp hours may be measured by providing a constant voltage input. The frequency of the pulse train on line 2C will remain constant, with the amplitude of the load current signals gated through on line 2F varying in proportion to the actual load current. Volt squared hours may be measured by applying the load voltage signal to both the load voltage input and the load current input. Amp squared hours may be measured by applying the load current signal to both the load voltage input and the load current input. Temperature hours may be measured by applying a temperature dependent electric signal to one input and a constant signal on the other input. The circuit may also be used for polyphase systems, using one circuit per phase and summing the signals from each circuit at the positive input of integrator 10A.

Other modifications and embodiments of the subject invention for any number of specific embodiments and circuit elements will readily come to one skilled in the art having the benefit of the teachings presented in the foregoing descriptions in accompaniment with the associated drawings. Therefore, the invention is not limited to the specific embodiments, and the modifications are intended to be included within the scope of the appended claims.

That which is claimed is:

1. Apparatus for electronically measuring the electricity used by a load comprising:
   (a) means for generating an analog load voltage signal proportional to the instantaneous load voltage, said means being responsive to any positive and negative portions of the load voltage;
   (b) means for generating a frequency modulated pulse train of signals in response to the load voltage signal, the instantaneous frequency of the pulses being proportional to the instantaneous amplitude of the load voltage signal;
   (c) means for generating an analog load current signal proportional to the instantaneous load current, said means being responsive to any positive and negative portions of the load current; and
   (d) logic means for gating the instantaneous load current signal during each pulse of the frequency modulated pulse train, said logic means generating an output signal comprising a train of pulses having a frequency proportional to the instantaneous load voltage and an amplitude proportional to the instantaneous load current, representing the product of the instantaneous load voltage and the instantaneous load current.

2. The apparatus of claim 1 wherein the means for generating a frequency modulated pulse train of signals comprises means for generating a train of uniform pulses, each pulse being substantially the same duration and substantially the same amplitude.

3. The apparatus of claim 1 wherein the means for generating a frequency modulated pulse train of signals comprises means for generating a train of unidirectional pulses.

4. The apparatus of claim 1 wherein the means for generating an analog load voltage signal comprises means for generating a rectified load voltage signal proportional to the instantaneous load voltage in response to an input voltage signal having positive and negative portions, and said means for generating a frequency modulated pulse train of signals is responsive to the rectified load voltage signal.

5. The apparatus of claim 1 further including zero crossing means for determining a change in the sign of the load voltage and providing a representative signal to the logic means.

6. The apparatus of claim 5 wherein the logic means is responsive to the zero crossings of the load voltage and the signal representing the amount of electric energy used.

7. The apparatus of claim 1 wherein the means for generating a load current signal comprises means for selectively providing either a positive or negative signal having an amplitude proportional to the amplitude of the load current, the amplitude the load current signal being negative only when one of the load voltage or load current is negative.

8. The apparatus of claim 1 wherein the means for generating a load current signal comprises:
   means for providing a positive signal proportional to the amplitude of the load current;
   means for providing a negative signal proportional to the amplitude of the load current; and
   switch means for transmitting either the positive signal or negative signal in response to a received logic signal.

9. The apparatus of claim 8 wherein the switch means comprises an analog gate.

10. The apparatus of claim 8 wherein the switch means is responsive to a signal from said logic means.

11. The apparatus of claim 8 wherein the switch means comprises means for transmitting either the positive signal or negative signal in response to a predetermined logical combination of signals representing the zero crossing of the loading voltage and the amount of electric energy used.

12. The apparatus of claim 1 further comprising means for integrating over time the output signal representing the product of the instantaneous load voltage and the instantaneous load current to generate a signal representing the amount of electric energy used by the load.

13. The apparatus of claim 12 wherein the means for integrating comprises an up-down integrator.

14. The apparatus of claim 13 wherein the up-down integrator comprises means for integrating up or down in response to a predetermined logical combination of signals representing the zero crossing of the load voltage and the amount of electric energy used.

15. The apparatus of claim 12 further comprising comparator means for generating a signal when the signal representing the amount of electric energy used by the load has reached a predetermined level.

16. Apparatus for electronically measuring the electricity at a load comprising:
   (a) means for generating a first analog load electric signal proportional to an instantaneous load condition, said means being responsive to any positive and negative portions of the load condition;
   (b) means for generating a frequency modulated pulse train of signals in response to the first analog signal, the instantaneous frequency of the pulses being proportional to the instantaneous amplitude of the first analog signal;
   (c) means for generating a second analog load electric signal, and
   (d) logic means for gating the instantaneous second analog signal during each pulse of the frequency modulated pulse train to generate an output signal, said output signal comprising a train of pulses having a frequency proportional to the instantaneous first signal and an amplitude proportional to the instantaneous second signal, representing the product of the instantaneous first signal and the instantaneous second signal.

17. The apparatus of claim 16 wherein the means for generating a first analog signal comprises means for generating an analog load voltage proportional to an instantaneous load voltage.

18. The apparatus of claim 16 wherein the means for generating a first analog signal comprises means for generating an analog load signal proportional to an instantaneous load voltage.

19. The apparatus of claim 16 wherein the means for generating a first analog signal comprises means for generating an analog signal having a predetermined phase shift from the instantaneous load condition.

20. The apparatus of claim 16 wherein the means for generating a first analog signal comprises means for generating a signal dependent upon temperature.

21. The apparatus of claim 16 wherein the means for generating a second analog signal comprises means for generating an analog load current signal proportional to an instantaneous load current.

22. The apparatus of claim 16 wherein the means for generating a second analog signal comprises means for generating a constant amplitude signal.

23. The apparatus of claim 16 wherein the means for generating a second analog signal comprises means for generating a signal equivalent in amplitude to the first signal.

24. A method of electronically measuring the electricity used by a load, the method comprising:
   (a) generating an analog load voltage signal in response to an input voltage signal proportional to the instantaneous load voltage and any positive and negative portions of the load voltage;
   (b) generating a frequency modulated pulse train signal in response to the load voltage signal, the instantaneous frequency of the pulses being proportional to the instantaneous amplitude of the load voltage signal;
   (c) generating an analog load current signal proportional to the instantaneous load current and any positive and negative portions of the load current; and
   (d) gating the instantaneous load current signal during each pulse of the frequency modulated pulse train to generate an output signal, said output signal comprising a train of pulses having a frequency proportional to the instantaneous load voltage and an amplitude proportional to the instantaneous load current, representing the product of the instantaneous load voltage and the instantaneous load current.

25. The method of claim 24 further comprising the step of integrating the output signal over time to generate a signal representing the amount of electric energy used by the load.

26. The method of claim 25 wherein the step of integrating the output signal over time comprises the step of integrating up or down.

27. The method of claim 26 wherein the step of integrating up or down comprises integrating up or down in response to a predetermined logical combination of signals representing the zero crossing of the load voltage and the amount of electric energy used.

28. The method of claim 24 wherein the step of generating a frequency modulated pulse train of signals comprises generating a train of uniform pulses, each pulse having substantially the same duration and substantially the same amplitude.

29. The method of claim 24 wherein the step of generating a frequency modulated pulse train of signals comprises generating a train of unidirectional pulses.

30. The method of claim 24 wherein the step of generating an analog load voltage signal comprises generating a rectified load voltage signal proportional to the instantaneous load voltage in response to an input voltage signal having positive and negative portions, and the step of generating a frequency modulated pulse train of signals comprises generating a frequency modulated pulse train of signals in response to the rectified load voltage signal.

31. The method of claim 24 wherein the step of generating a load current signal comprises transmitting either a positive or negative load current signal having an amplitude proportional to the amplitude of the load current in response to the receipt of a logical combination of signals representing the zero crossing of the load voltage and the amount of electric energy used.

32. The method of claim 24 wherein the step of gating the load current signal comprises transmitting either a positive or negative load current signal having an amplitude proportional to the amplitude of the load current in response to the receipt of a logical combination of signals representing the zero crossing of the load voltage and the amount of electric energy used.

33. The method of claim 24 wherein the step of generating a load current signal comprises selectively providing either a positive or negative load current signal having an amplitude proportional to the amplitude of the load current, and providing a negative load current signal only when one of the load voltage or load current is negative.

* * * * *